United States Patent
Ogawa (10) Patent No.: US 8,183,761 B2
(45) Date of Patent: May 22, 2012

(54) LIGHT EMITTING APPARATUS

(75) Inventor: Yoshihiro Ogawa, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 595 days.

(21) Appl. No.: 12/176,604

(22) Filed: Jul. 21, 2008

(65) Prior Publication Data

US 2009/0021138 A1    Jan. 22, 2009

(30) Foreign Application Priority Data

Jul. 20, 2007 (JP) ................ 2007-189088

(51) Int. Cl.
- *H01L 33/62* (2010.01)
- *H01L 33/38* (2010.01)
- *H01L 33/52* (2010.01)

(52) U.S. Cl. ......... 313/498; 313/512; 313/500; 257/99; 257/100; 257/91

(58) Field of Classification Search ......... 313/498–512; 257/98–100, 666–677, 91; 362/555, 800

See application file for complete search history.

(56) References Cited

U.S. PATENT DOCUMENTS

| | | | | |
|---|---|---|---|---|
| 5,331,512 | A | * | 7/1994 | Orton ............................ 361/760 |
| 5,670,797 | A | * | 9/1997 | Okazaki ......................... 257/91 |
| 6,953,255 | B2 | * | 10/2005 | Horiuchi et al. ............... 362/611 |

FOREIGN PATENT DOCUMENTS

| JP | 646038 | | 1/1989 |
|---|---|---|---|
| JP | 2003258313 A | * | 9/2003 |

* cited by examiner

*Primary Examiner* — Mariceli Santiago (74) *Attorney, Agent, or Firm* — Kenealy Vaidya LLP

(57) ABSTRACT

A light emitting apparatus can include a base, a light emitting device and a resin portion on one side of the base for covering the light emitting device, a wiring thereof, and the like. The light emitting apparatus can be configured to prevent the exfoliation of the resin portion from the base even when a substantial amount of load is applied thereon by a mounter during the mounting operation onto a mounting board. The ratio of an occupied area of the patterned electrodes on the base within a predetermined area including an area where the resin portion is provided is made large enough to prevent the patterned electrodes from being flexed during mounting operation, and the ratio of an occupied area of the patterned electrodes on the upper and rear surfaces of the base just outside of the predetermined area is made smaller than the predetermined ratio.

2 Claims, 6 Drawing Sheets

LIGHT EMITTING APPARATUS

This application claims the priority benefit under 35 U.S.C. §119 of Japanese Patent Application No. 2007-189088 filed on Jul. 20, 2007, which is hereby incorporated in its entirety by reference.

BACKGROUND

1. Technical Field

The presently disclosed subject matter relates to a light emitting apparatus, and in particular, a reverse surface mount type LED apparatus.

2. Description of the Related Art

Figure 1:
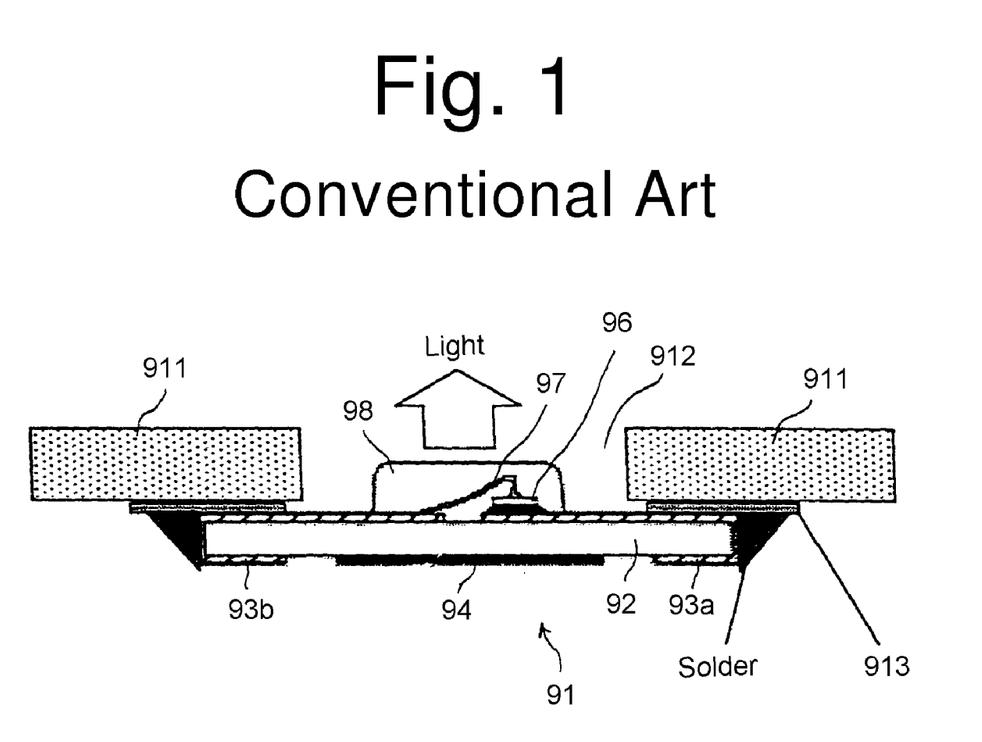
FIG. 1 is a cross sectional view showing the configuration of a conventional reverse surface mount type LED apparatus.

FIG. 1 shows a cross sectional view showing the configuration of a conventional surface mount LED apparatus (see, for example, Japanese Utility Model Application Laid-Open No. Sho. 64-6038), which is mounted in a reverse surface mount fashion. With reference to FIG. 1, the reverse surface mount LED apparatus 91 is mounted on a lower surface of a mounting board 911 having a hole 912 formed therethrough (in a reverse surface mount fashion) so as to project light through the hole 912 of the mounting board 911. The reverse surface mount LED apparatus 91 shown in FIG. 1 does not protrude over the upper surface of the mounting board 911 toward the illumination direction when compared to those mounted on the upper surface of a mounting board. Accordingly, this reverse surface mount type LED apparatus can contribute to the low-profile products, and can be applied to, for example, reverse surface mount type custom LED tail lamps (CTL) or the like.

Specifically, the reverse surface mount type LED apparatus 91 of FIG. 1 can include: a base 92, a first patterned electrode 93a and a second patterned electrode 93b extending from the upper surface of the base 92 to the rear surface thereof; an abutment plate 94 for receiving a mounter; a light emitting device (or an LED device) 96 mounted on the first patterned electrode 93a on the upper side of the base 92; a wiring 97 (a bonding wiring) 97 connecting the light emitting device 96 to the second patterned electrode 93b; and a resin portion 98 formed on the upper side of the base 92 for covering the light emitting device 96, the wiring 97, and the like.

The reverse surface mount LED apparatus 91 configured as above can be mounted as follows: A soldering paste is applied onto soldering lands 913 provided on both sides of the hole 912 of the mounting board 911 via a mask or the like; the LED apparatus 91 is mounted on the mounting board 911 by applying a load to the apparatus 91 by means of a mounter (see FIG. 2); and the soldering paste is melted by reflowing process or the like process and then solidified to fix the LED apparatus 91.

Figure 2:
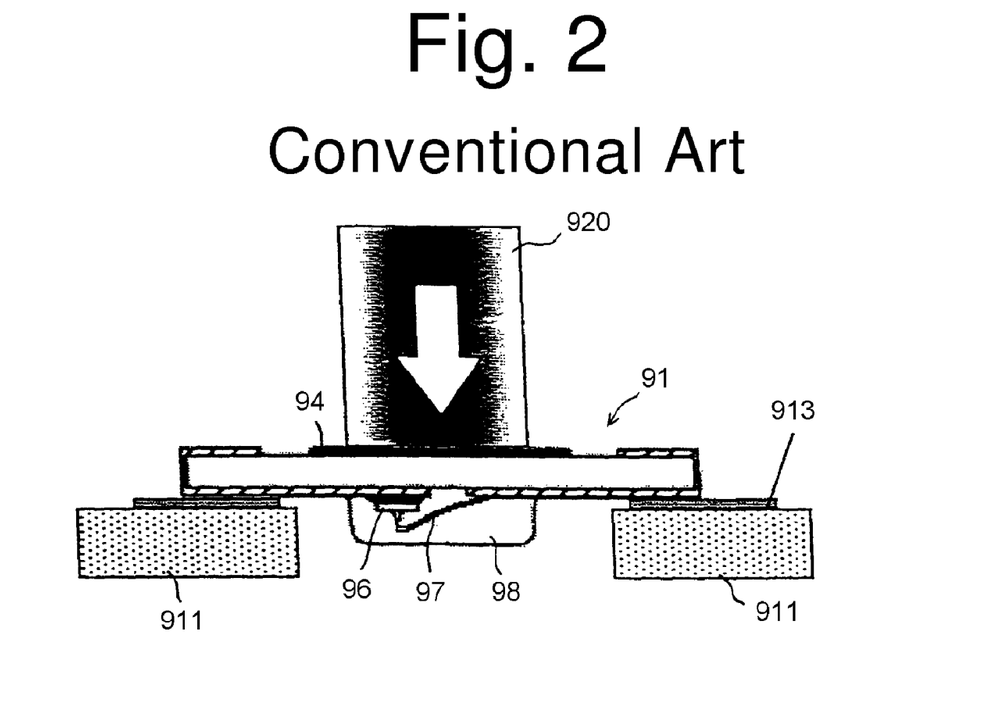
FIG. 2 is a cross sectional schematic view showing a conventional mounting operation for a reverse surface mount type LED apparatus onto a mounting board.
Figure 3:
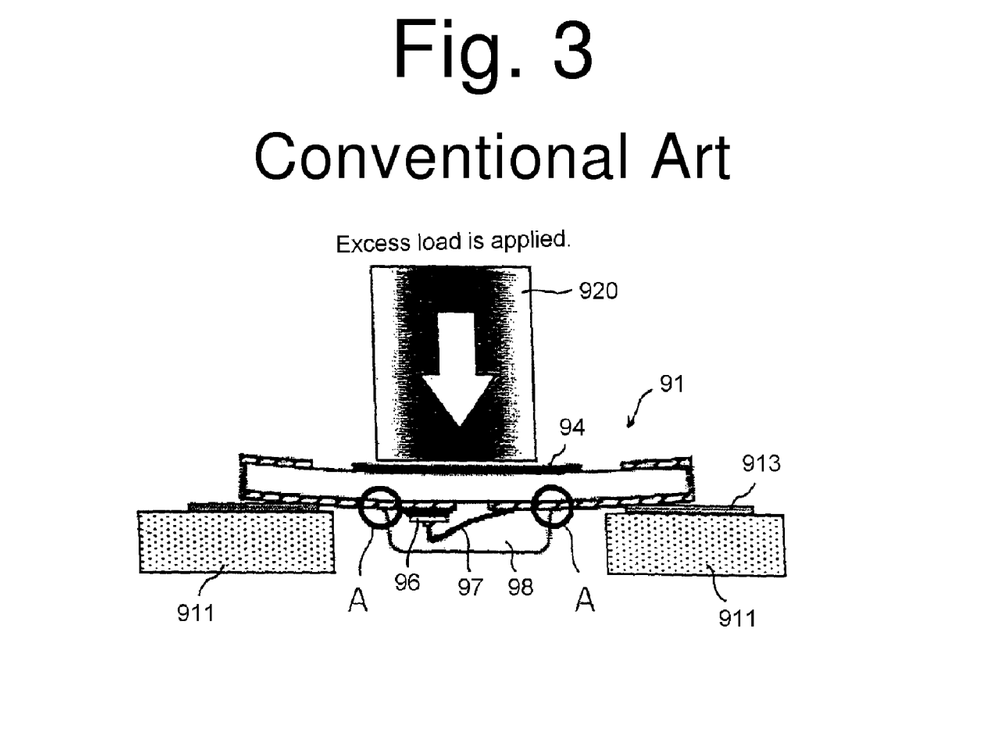
FIG. 3 is a cross sectional schematic view showing a conventional mounting operation for a reverse surface mount type LED apparatus onto a mounting board.

As described above, a mounter 920, an example of which is shown in FIG. 2, is used for mounting a reverse surface mount type LED apparatus 91 on a mounting board 911. Some types of such a mounter cannot control the application of load during mounting operation. In some cases, as shown in FIG. 3, an excessive load can be applied to the reverse surface mount type LED apparatus 91. In particular, the pressure force may be concentrated at the center area of the reverse surface mount type LED apparatus 91 because the hole 912 is formed in the mounting board 911 correspondingly. In a preferred case, the pressure force can be dispersed over the entire body of the reverse surface mount type LED apparatus 91 including the resin portion 98. However, the thick resin portion 8 may be stronger than the other parts, resulting in being stiff (not flexible). As a result, when a stress is concentrated around the center area of the reverse surface mount type LED apparatus 91, deformation may occur around the boundary of the resin portion 98. Although the resin portion 98 is adhered to the base 92, when the stress is applied therearound, the resin portion 98 may be partly exfoliated from the base 92 around the portion as shown by the reference symbol A in FIG. 3. When the resin portion 98 is exfoliated from the base 92, the LED device 96, the bonding wiring 97, and the like covered by the resin portion 98 may also be lifted up from the base 92. This may cause the electrical connection failure, resulting in the lighting failure after completion of the mounting operation.

SUMMARY

The presently disclosed subject matter was devised in view of these and other problems and in association with the conventional art. According to an aspect of the presently disclosed subject matter, a light emitting apparatus can be provided which has a base, a light emitting device and a resin portion on one side of the base for covering the light emitting device and a wiring thereof and the like. The light emitting apparatus can prevent the exfoliation of the resin portion from the base even when a substantial amount of load is applied thereon by a mounter during the mounting operation onto a mounting board.

Through the course of intensive study, the present inventors have found that the conventional problems can be solved by increasing a first ratio of occupied area of first and second patterned electrodes on the upper and rear surfaces of a base within a predetermined area (including the area where a resin portion is formed). On the other hand, a second ratio of the occupied area of the first and second patterned electrodes on the upper and rear surfaces of the base just outside of the predetermined area (including the area where the resin portion is formed) is decreased, thereby attempting to solve certain problems and providing certain characteristics. This finding leads to the presently disclosed subject matter. It should be noted that the ratio of the occupied area means the ratio of the patterned electrode area occupied within a predetermined area of the base portion and is represented by (the area of patterned electrode formed within the predetermined area)/(the predetermined area).

According to another aspect of the presently disclosed subject matter, a light emitting apparatus can include: a base having an upper surface and a rear surface; a first patterned electrode and a second patterned electrode extending from the upper surface of the base to the rear surface thereof; a light emitting device mounted on the first patterned electrode on the upper surface of the base; a wiring portion connecting the light emitting device to the second patterned electrode; and a resin portion formed on the upper surface of the base, the resin portion configured to cover at least the light emitting device and the wiring portion, wherein the first and second patterned electrodes are separated from each other on both sides of the upper and rear surfaces of the base with a predetermined distance; and a first ratio is a ratio of an occupied area of the first and second patterned electrodes on the upper and rear surfaces of the base within the predetermined area including the area where the resin portion is provided, and a second ratio of an occupied area of the first and second patterned electrodes on the upper and rear surfaces of the base within an area just outside of the predetermined area including the area where the resin portion is provided is made smaller than the first ratio.

The above-described light emitting apparatus can be a reverse surface mount type.

In the above-described light emitting apparatus, the first patterned electrode can be provided to extend up to a center area of the base in a longitudinal direction on the upper surface of the base, and the light emitting device can be provided on the first patterned electrode at the center area of the base.

In the above-described light emitting apparatus, the first patterned electrode and the second patterned electrode can be separated from each other on the rear surface of the base along a straight line having at least one bent portion or a curved line in a width direction.

In the above-described light emitting apparatus, the base can be formed of a glass epoxy material having a thickness of from 0.05 mm to 1.0 mm.

In the above-described light emitting apparatus, the first patterned electrode can be formed of a material including at least one selected from the group consisting of Cu, Ni, Au and Ag and have a thickness of from 0.02 mm to 0.1 mm. Furthermore, the second patterned electrode can be formed of a material including at least one selected from the group consisting of Cu, Ni, Au and Ag and have a thickness of from 0.02 mm to 0.1 mm.

In the above-described light emitting apparatus, the resin portion can be formed of an epoxy resin material.

In the above-described light emitting apparatus, the first ratio can be made large enough to prevent the patterned electrodes on the upper surface and the rear surface within the predetermined area including the area where the resin portion is provided from being flexed when the light emitting apparatus is applied with a load during mounting operation onto a mounting board.

In the above-described light emitting apparatus, the first ratio can be set to 50% or larger.

In the above-described light emitting apparatus, the second ratio of the occupied area of the first and second patterned electrodes on the upper and rear surfaces of the base within the area just outside of the predetermined area can be set to be less than 50%.

In the above-described light emitting apparatus, the area just outside of the predetermined area including the area where the resin portion is provided can be an area H3 defined between the predetermined area H1 and an area H4 at which the light emitting apparatus is to be mounted on a mounting board, and the relationships between the ratios of the occupied areas within the respective areas H1, H3, and H4 can hold (the ratio within the area H1)>(the ratio within the area H3) and (the ratio within the area H4)>(the ratio within the area H3).

The light emitting apparatus in accordance with the presently disclosed subject matter can be configured as a reverse surface mount type, and configured as described above. Accordingly, it is possible to prevent the resin portion from being exfoliated from the base even when a mounter for mounting the apparatus onto a mounting board applies a substantial load on the apparatus.

In the light emitting apparatus as configured described above, the first patterned electrode can be provided to extend up to a center area of the base on the upper surface thereof in a longitudinal direction, and the light emitting device can be provided on the first patterned electrode at the center area of the base. By doing so, even when the resin portion is exfoliated from the base, the lifting up of the device and/or wiring can be effectively prevented.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EMBODIMENTS

A description will now be made below with respect to light emitting apparatuses made in accordance with principles of the presently disclosed subject matter with reference to the accompanying drawings and with respect to exemplary embodiments.

Figure 4:
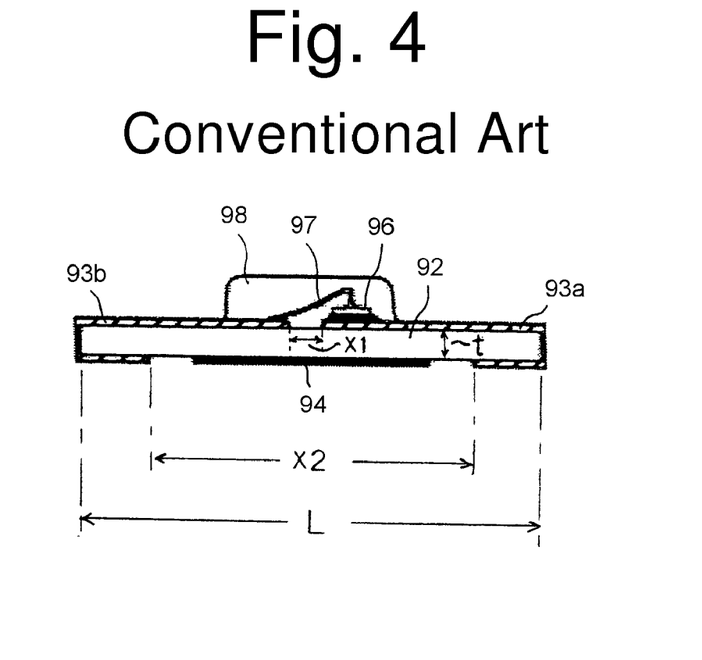
FIG. 4 is a cross sectional view showing a conventional reverse surface mount type LED apparatus.
Figure 5A:
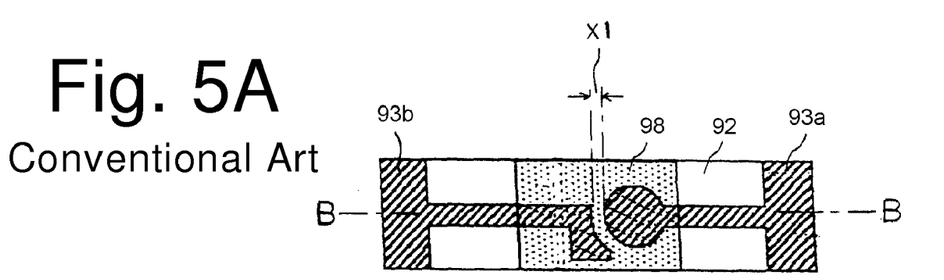
FIGS. 5A and 5B are diagrams showing the configuration of patterned electrodes of a conventional light emitting apparatus as seen from the top side and rear side, respectively.
Figure 5B:
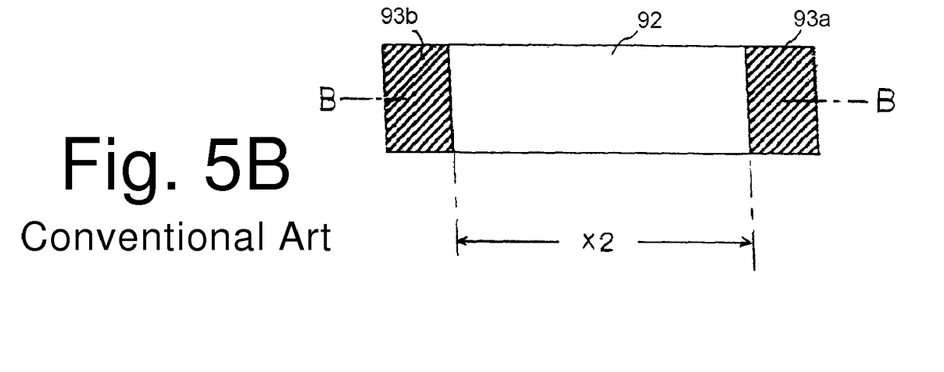

In view of the foregoing description, and characteristics and problems of conventional art apparatuses, an example of a light emitting apparatus made in accordance with principles of the disclosed subject matter can have larger patterned electrodes 3a and 3b formed on the upper and rear surfaces of a base within a predetermined area (including the area where a resin portion is formed) as compared with the conventional light emitting apparatus as shown in FIGS. 4 to 5B. Namely, the ratio of occupied area of the patterned electrodes (first ratio) is increased. On the other hand, the structure can be designed such that the ratio of the occupied area of the first and second patterned electrodes 3a and 3b on the upper and rear surfaces of the base 2 just outside of the predetermined area (including the area where the resin portion 8 is formed) (second ratio) is made less than the first ratio. It should be noted that the ratio of the occupied area means the ratio of the patterned electrode area occupied within a predetermined area and is represented by (the area of patterned electrode formed within the predetermined area)/(the predetermined area). The ration of the occupied area can also be represented by (the area of patterned electrode formed within an adjacent or alternative area)/(the adjacent or alternative area).

Namely, in accordance with the presently disclosed subject matter, the first ratio of the occupied area of the first and second patterned electrodes on the upper and rear surfaces of a base within a predetermined area including an area where the resin portion is provided is made large enough to prevent the patterned electrodes on the upper surface and the rear surface within the predetermined area including the area where the resin portion is provided from being flexed when the light emitting apparatus is applied with a load during mounting operation onto a mounting board. On the other hand, the second ratio of the occupied area of the first and second patterned electrodes on the upper and rear surfaces of the base just outside of the predetermined area including the area where the resin portion is provided can be made smaller than the first ratio of the occupied area of the first and second patterned electrodes on the upper and rear surfaces of the base within the predetermined area including the area where the resin portion is provided.

Hereinafter, a detailed description of the presently disclosed subject matter will be given while the presently disclosed subject matter is compared with the conventional and several comparative examples.

FIG. 4 shows the same type of conventional light emitting apparatus 91 as shown in FIGS. 1 through 3.

The light emitting apparatus 91 is a reverse surface mount type LED apparatus as in the foregoing conventional example. The LED apparatus 91 can include: a base 92, a first patterned electrode 93a and a second patterned electrode 93b extending from the upper surface of the base 92 to the rear surface thereof; an abutment plate 94 for receiving a mounter; a light emitting device (or an LED device) 96 mounted on the first patterned electrode 93a on the upper side of the base 92; a wiring 97 (a bonding wiring) 97 connecting the light emitting device 96 to the second patterned electrode 93b; and a resin portion 98 formed on the upper side of the base 92 for covering the light emitting device 96, the wiring 97, and the like.

In this instance, the base 92 can be formed of a glass epoxy material, for example. The longitudinal dimension L of the base 92 can be approximately 3.2 mm, and the thickness t of the base can be approximately 0.2 mm.

The first and second patterned electrodes 93a and 93b can be formed of, for example, Cu, Ni, Au, or Ag. The thickness thereof can be in the range of from 0.02 mm to 0.07 mm.

The resin portion 98 can be formed of an epoxy resin material, for example.

FIG. 5A shows the first and second patterned electrodes 93a and 93b on the upper side of the base 92 of the light emitting apparatus 91 shown in FIG. 4 (on the side provided with the resin portion 98, or the resin portion side). FIG. 5B shows the first and second patterned electrodes 93a and 93b on the rear side of the base 92 of the light emitting apparatus 91 shown in FIG. 4 (on the side not provided with the resin portion 98, or the opposite-resin portion side). It should be noted that FIG. 4 corresponds to the cross sectional view of FIGS. 5A and 5B along the line B-B.

With reference to FIG. 5A, on the upper surface of the base 92 the first patterned electrode 93a is separated away (electrically isolated) from the second patterned electrode 93b with a predetermined distance x1 (for example, 0.2 mm). The light emitting device 96 is mounted on the first patterned electrode 93a while the bonding wiring 97 of the light emitting device 96 is connected to the second patterned electrode 93b.

Figure 6:
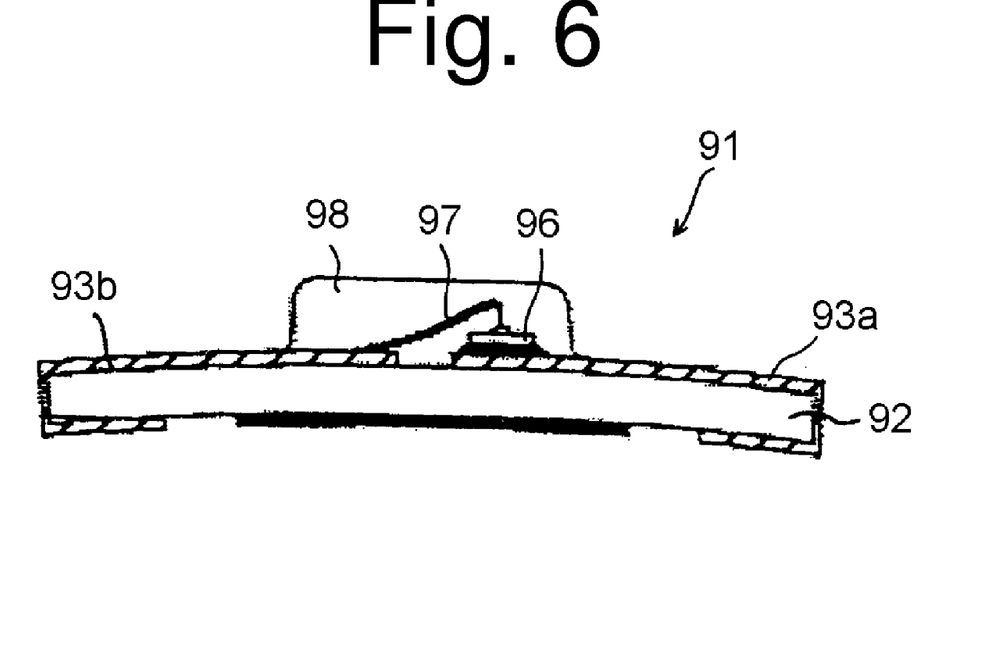
FIG. 6 is a cross sectional view illustrating the occurrence of flexure in a conventional light emitting apparatus.

With reference to FIG. 5B, on the rear surface of the substrate 92 the first patterned electrode 93a is separated away (electrically isolated) from the second patterned electrode 93b with a predetermined distance x2 (for example, 2.2 mm). Furthermore, the light emitting apparatus 91 as shown in FIG. 4 has an elongated shape. In this instance, the base 92 may have a thickness t of approximately 0.2 mm because the product damage can be expected due to the applied load during mounting operation. Even in the above configuration, when the mounter applies a larger load than the assumed one in some cases, flexure may occur in the base as shown in FIG. 6.

In this case, such an excess load may exfoliate the resin portion 98 from the base 92. This can cause the electrical connection failure due to the lifting up of the device and/or wiring, resulting in the lighting failure after completion of the mounting operation.

In order to prevent the light emitting apparatus 91 from being flexed due to such a load, the thickness t of the base 92 may be increased to be more than the normal thickness of 0.2 mm, which may be the simplest countermeasure. However, there are some limitations as to the total height of the light emitting apparatus 91 or the like, and therefore the thickness t of the base 92 cannot always be simply increased in order to solve the above-referenced problems.

In order to reduce the degree of flexure of a light emitting apparatus 1 (as show in FIG. 10), the present inventors examined the increased areas of first and second patterned electrodes 3a and 3b on both the upper and rear surfaces of the light emitting apparatus 1. In this case, the entire strength can be increased. In fact, the thickness of the first and second patterned electrodes 3a and 3b is designed to be about 25% of the thickness t of the base 2 on a single side. Accordingly, the increased areas of the first and second patterned electrodes 3a and 3b can increase the load resistance of the light emitting apparatus 1, resulting in the prevention of flexure to some extent.

The present inventors examined several electrode patterns formed on a base, which serve as comparative examples, and the perceived characteristics and associated results thereof will be described hereinafter.

Figure 7:
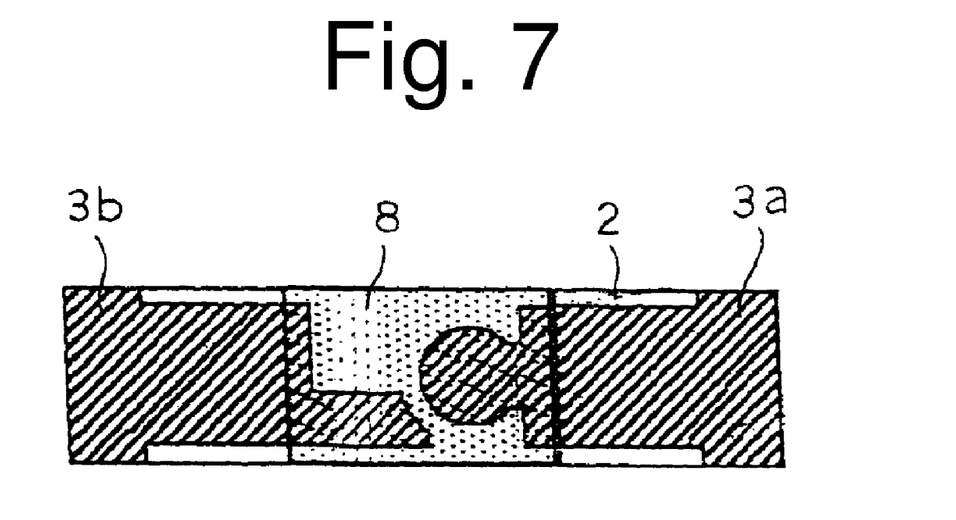
FIG. 7 is a top plan view showing a comparative example of a base on which first and second patterned electrodes are formed with the area thereof being increased as compared to the area of conventional patterned electrodes.

FIG. 7 shows one comparative example in which the areas of the first and second electrode patterns 3a and 3b are increased on the upper surface (the resin portion side) to a degree that is more than the conventional case as shown in FIG. 5A.

Figure 8A:
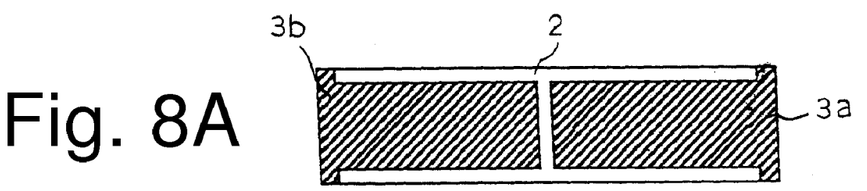
FIGS. 8A, 8B, and 8C are rear side views showing comparative examples of bases on which first and second patterned electrodes are formed with the area thereof being increased as compared to the area of conventional patterned electrodes.
Figure 8B:
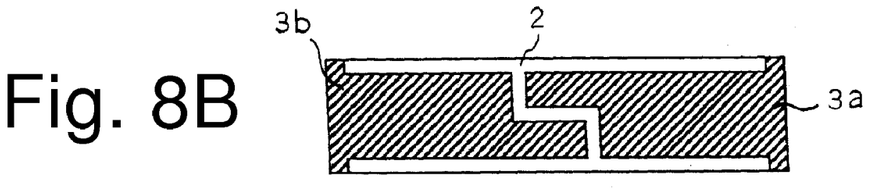
Figure 8C:
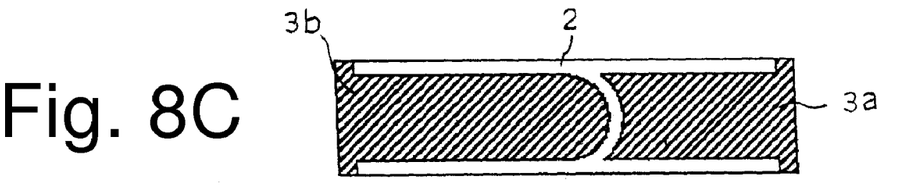

In FIGS. 8A, 8B, and 8C, several comparative examples are shown in which the areas of the first and second patterned electrodes 3a and 3b are increased on the rear surface (the opposite-resin portion side) to a degree that is more than the conventional case as shown in FIG. 5B.

In either case, the comparative examples have a separated portion between the first patterned electrode 3a and the second patterned electrode 3b near the center of the rear surface as shown in FIGS. 8A, 8B, and 8C. This means that the center area may not be sufficiently strengthened due to the separated portion, which may cause the formation of flexure due to the concentrated stress at the center area. Namely, the portion near the resin portion 8 may still be flexed. Accordingly, even in the above configurations of the comparative examples, an excess load may exfoliate the resin portion 8 from the base 2, and this can cause an electrical connection failure due to the lifting up of the device and/or wiring, resulting in failure of the lighting device after completion of the mounting operation.

Figure 9A:
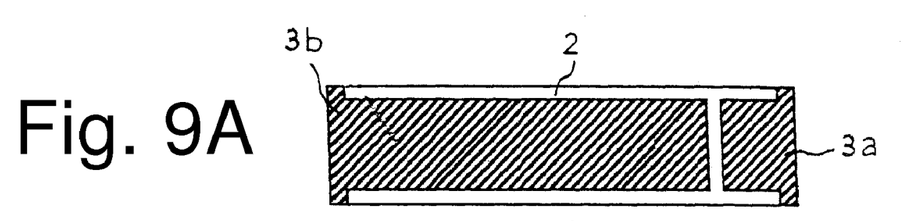
FIGS. 9A, 9B, and 9C are rear side views showing still other comparative examples of bases on which first and second patterned electrodes are formed at an area other than the center area while the area thereof is also increased relative to conventional patterned electrodes.
Figure 9B:
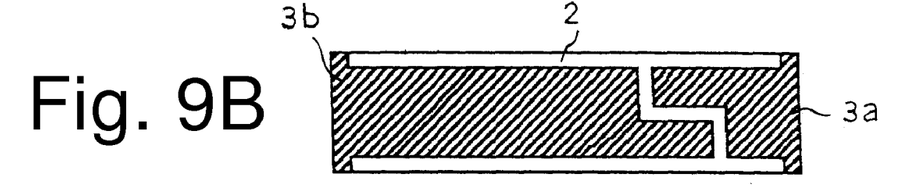
Figure 9C:
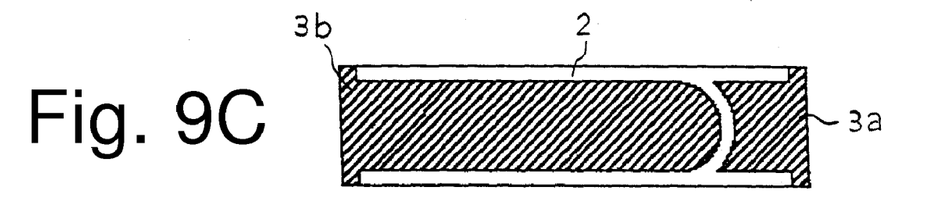

In order to cope with the above-described disadvantages of the comparative examples shown in FIGS. 8A, 8B, and 8C, the separated portion between the first and second patterned electrodes 3a and 3b can be provided on an area other than the area where the resin portion 8 is provided (namely, the area where the applied load by the mounter may affect the resin portion 8). In other words, the separated portion can be shifted from the center area where the resin portion 8 is provided, and several such comparative examples are shown in FIGS. 9A, 9B, and 9C. In these comparative examples, however, when an examining probe is contacted to the product from the rear side to examine for lighting failure, short-circuiting may occur depending on the size and position of such a probe. The short-circuiting can be prevented by covering the separated portion with an insulating material such as a resist layer. However, in this case, an additional step of providing a resist film on the area is required, which increases the manufacturing cost. Furthermore, such a resist film may be exfoliated in some cases. When the resist film is too thin, short-circuiting may still occur.

A description of an exemplary embodiment of the presently disclosed subject matter will now be made with reference to FIGS. 10, 11A, and 11B, which show an exemplary light emitting apparatus 1. It should be noted that FIG. 10 corresponds to the cross sectional view of FIGS. 11A and 11B along line B-B.

Figure 10:
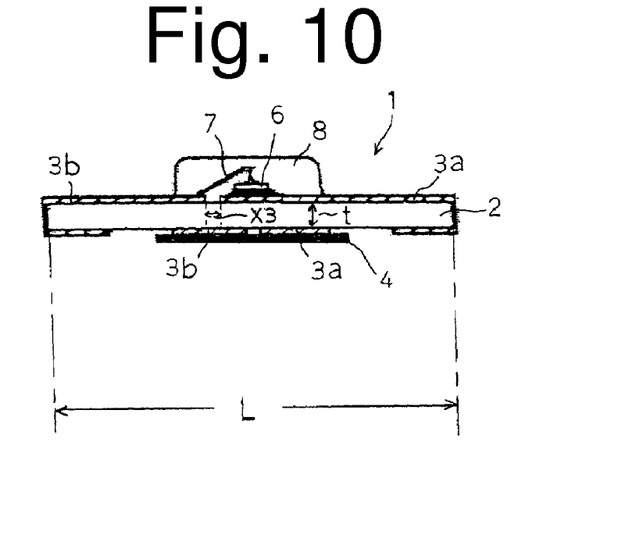
FIG. 10 is a cross sectional view showing an example of a light emitting apparatus made in accordance with principles of the presently disclosed subject matter.

With reference to FIG. 10, the light emitting apparatus 1 can be configured as a reverse surface mount type LED apparatus. The LED apparatus 1 can include: a base 2, a first patterned electrode 3a and a second patterned electrode 3b extending from the upper surface of the base 2 to the rear surface thereof; an abutment plate 4 for receiving a mounter; a light emitting device (such as an LED device) 6 mounted on the first patterned electrode 3a on the upper side of the base 2; a wiring 7 (for example, a bonding wiring) connecting the light emitting device 6 to the second patterned electrode 3b; and a resin portion 8 formed on the upper side of the base 2 for covering the light emitting device 6, the wiring 7, and the like.

According to the presently disclosed subject matter, the base 2 can be formed of a glass epoxy material, for example. The longitudinal dimension L of the base 2 can be approximately 3.2 mm, and the thickness t of the base 2 can be in the range of from approximately 0.05 mm to approximately 1.0 mm.

The first and second patterned electrodes 3a and 3b can be formed of a material including at least one selected from the group consisting of Cu, Ni, Au and Ag and can have a thickness of from 0.02 mm to 0.1 mm.

The resin portion 8 can be formed of an epoxy resin material, for example.

Figure 11A:
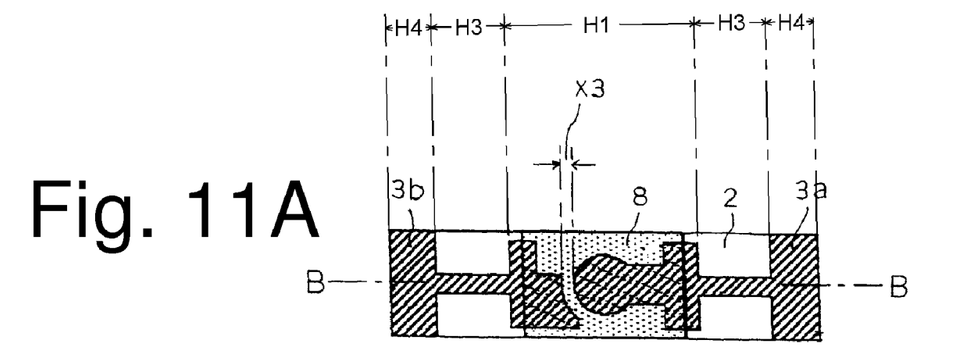
FIGS. 11A and 11B are diagrams showing the base of the light emitting apparatus of FIG. 10 as seen from the top side and rear side, respectively

FIG. 11A shows the first and second patterned electrodes 3a and 3b on the upper side of the base 2 of the light emitting apparatus 1 shown in FIG. 10 (on the side provided with the resin portion 8, or the resin portion side). FIG. 11B shows the first and second patterned electrodes 3a and 3b on the rear side of the base 2 of the light emitting apparatus 1 shown in FIG. 10 (on the side not provided with the resin portion 8, or the opposite-resin portion side).

With reference to FIG. 11A, on the upper surface of the base 2 the first patterned electrode 3a can be separated away (electrically isolated) from the second patterned electrode 3b with a predetermined distance x3 (for example, 0.1 mm). The light emitting device 6 can be mounted on the first patterned electrode 3a while the bonding wiring 7 of the light emitting device 6 can be connected to the second patterned electrode 3b.

Figure 11B:
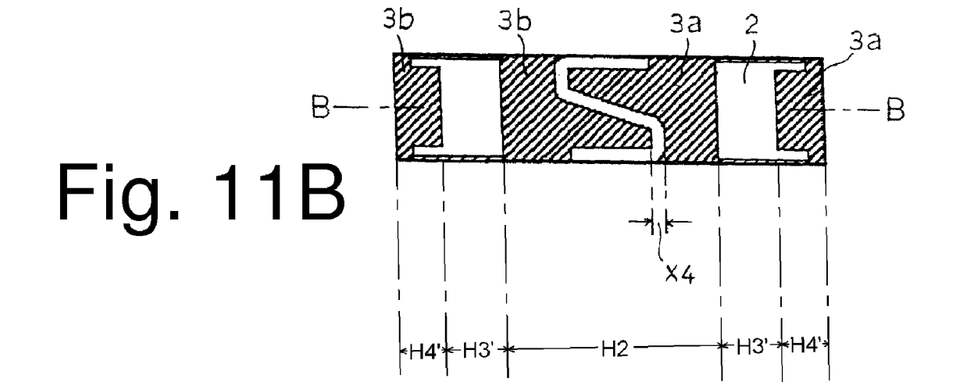

With reference to FIG. 11B, on the rear surface of the substrate 2 the first patterned electrode 3a can be separated away (electrically isolated) from the second patterned electrode 3b with a predetermined distance x4 (for example, 0.15 mm). Furthermore, in the present exemplary embodiment the first patterned electrode 3a and the second patterned electrode 3b can be separated from each other on the rear surface of the base in a manner that does not follow a single straight line (such as the separated area at the center as shown in FIG. 8A), but along a straight line having at least one bent portion or a curved line in a width direction. Namely, the first and second patterned electrodes 3a and 3b can be arranged separately from each other while being shaped like symmetric jigsaw puzzle pieces in the longitudinal direction.

A detailed description will now be given of the light emitting apparatus 1 in accordance with the presently disclosed subject matter while comparing the apparatus of FIG. 11A with that of FIG. 5A. In the light emitting apparatus 1 of FIG. 11A, the ratio of the occupied area of the first and second patterned electrodes 3a and 3b on the upper surface of the base 2 within the predetermined area H1 (including the area where the resin portion 8 is formed) can be increased as compared with the conventional apparatus as shown in FIG. 5A. On the other hand, the ratio of the occupied area of the first and second patterned electrodes 3a and 3b on the upper surface of the base 2 within a predetermined (or adjacent) area H3 which is located just outside of the predetermined area H1 can be decreased to be less than the ratio of the occupied area of the first and second patterned electrodes 3a and 3b within the predetermined area H1.

In FIG. 11A, the reference symbol H4 represents an area at which the light emitting apparatus 1 is mounted on a mounting board in a reverse surface mounting fashion. In this instance, the relationships between the occupied area ratios within the respective areas on the upper surface of the base 2 are (the ratio within H1)>(the ratio within H3) and (the ratio within H4)>(the ratio within H3).

Furthermore, a description will be given of the light emitting apparatus 1 in accordance with the presently disclosed subject matter while comparing the apparatus of FIG. 11B with that of FIG. 5B. On the rear surface (the opposite-resin portion side) of the base 2 in the light emitting apparatus 1, the ratio of the occupied area of the first and second patterned electrodes 3a and 3b within the predetermined area H2 (including an area obtained by projecting the area, where the resin portion 8 is formed, onto the rear surface) can be increased as compared with the conventional apparatus as shown in FIG. 5B. It should be noted that no patterned electrodes are provided within the predetermined area H2 in the conventional light emitting apparatus 1 of FIG. 5B. On the other hand, the ratio of the occupied area of the first and second patterned electrodes 3a and 3b within a predetermined area H3' which is located just outside of the predetermined area H2 can be decreased to be less than the ratio of the occupied area of the first and second patterned electrodes 3a and 3b within the predetermined area H2.

In FIG. 11B, the reference symbols H3' and H4' represent respective areas on the rear surface corresponding to the areas H3 and H4, respectively. In this instance, the relationships between the occupied area ratios within the respective areas on the rear surface of the base 2 are (the ratio within H2)>(the ratio within H3') and (the ratio within H4')>(the ratio within H3').

In the exemplary embodiment shown in FIGS. 11A and 11B, the first ratio of the occupied area of the first and second patterned electrodes 3a and 3b on the upper and rear surfaces of the base within a predetermined area including an area where the resin portion is provided can be made large enough to prevent the patterned electrodes 3a and 3b on the upper surface and the rear surface within the predetermined area including the area where the resin portion is provided from being flexed when the light emitting apparatus is applied with a load during a mounting operation of the device onto a mounting board. This configuration can effectively strengthen the area near the resin portion (namely, the portion of the base 2 within the areas H1 and H2 in FIGS. 11A and 11B). On the other hand, the strength of the area other than that near the resin portion can be weakened as compared to the strength of the area near the resin portion. Namely, the second ratio of an occupied area of the first and second patterned electrodes on the upper and rear surfaces of the base within the area which is located just outside of the predetermined area including the area where the resin portion is provided (namely, in particular, the areas H3 and H3' in FIGS. 11A and 11B) can be made smaller than the first ratio of the occupied area of the first and second patterned electrodes on the upper and rear surfaces of the base within the predetermined area including the area where the resin portion is provided. Accordingly, this configuration can effectively disperse the pressed force applied by the mounter (and accordingly stress within the body) during the mounting operation to deform the base in the area other than the area where the resin portion 8 is provided, in particular, in the areas just outside of the resin-portion provided area, thereby preventing the resin portion 8 from being exfoliated from the base 2.

According to the presently disclosed subject matter, the first ratio of the occupied area of the first and second patterned electrodes 3a and 3b on the upper and rear surfaces of the base near the resin portion can be made large enough to prevent the patterned electrodes 3a and 3b on the upper surface and the rear surface near the resin portion from being flexed when the light emitting apparatus is applied with a load during a mounting operation onto a mounting board. This can selectively reinforce the area where the resin portion 8 is provided. Specifically, the first ratio of the occupied area of the first and second patterned electrodes 3a and 3b on the upper and rear surfaces of the base within the predetermined area where the resin portion 8 is provided can be set to be 50% or more. At the same time, the second ratio of an occupied area of the first and second patterned electrodes on the upper and rear surfaces of the base just outside of the predetermined area (including the corresponding area where the resin portion 8 is provided) can be made smaller than the first ratio of the occupied area of the first and second patterned electrodes on the upper and rear surfaces of the base within the predetermined area near the resin portion. This can weaken the area other than the predetermined area (including the area where the resin portion is provided). Specifically, the second ratio of the occupied area of the first and second patterned electrodes 3a and 3b on the upper and rear surfaces of the base just outside of the predetermined area where the resin portion 8 is provided can be set to be 50% or less. Accordingly, this configuration can effectively disperse the pressed force applied by the mounter during the mounting operation towards the weakened area other than the predetermined area (including the area where the resin portion is provided), thereby preventing the resin portion 8 from being exfoliated from the base 2. It should be noted that the phrase "the first ratio of the occupied area of the first and second patterned electrodes 3a and 3b on the upper and rear surfaces of the base near the resin portion is made large enough to prevent the patterned electrodes 3a and 3b on the upper surface and the rear surface near the resin portion from being flexed when the light emitting apparatus is applied with a load during mounting operation onto a mounting board" means that the ratio of the occupied area of the electrode patterns is selected so that the amount of flexure within the predetermined area including the area where the resin portion 8 is provided is made smaller than the amount of flexure within the area just outside of the predetermined area.

In the light emitting apparatus 1 as shown in FIG. 11A, the first patterned electrode 3a can be provided to extend up to a center area of the base in a longitudinal direction on the upper surface of the base. The light emitting device 6 is provided on the first patterned electrode 3a at the center area of the base 2 in the longitudinal direction.

In the light emitting apparatus configured as described above wherein the light emitting device 6 is provided at the center area of the base 2, the first patterned electrode 3a can be configured to extend up to the center area of the base 2 in the longitudinal direction. By doing so, even when the resin portion is exfoliated from the base, the lifting up of the device and/or wiring can be effectively prevented.

In the light emitting apparatus 1 as shown in FIG. 11B, the first patterned electrode 3a and the second patterned electrode 3b can be separated from each other on the rear surface of the base 2 along a line that does not follow a single straight line (such as the separated area at the center as shown FIG. 8A), but along a line that includes a straight line having at least one bent portion or curved line in a width direction. Furthermore, the first and second patterned electrodes 3a and 3b can be arranged separately from each other while being shaped like symmetric jigsaw puzzle pieces in the longitudinal direction. This configuration can disperse the stress, which otherwise is easily concentrated at the center area, toward the thick patterned electrodes 3a and 3b. The separated patterned electrodes are not limited to those shapes disclosed in FIG. 11B. The separated patterns as shown in FIGS. 8B (separated by straight lines with two bent portions) and 8C (separated by a curved line) can be used appropriately.

In the above description, the light emitting apparatus 1 is a reverse surface mount type LED apparatus as one example and employs an LED device as a light emitting device 6. However, the presently disclosed subject matter is not limited to these exemplary embodiments. Examples of the light emitting device 6 include a semiconductor laser devices. In addition, the top of the light emitting apparatus 1 may be configured differently. For example, resin 8 can be shaped differently or removed altogether.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light emitting apparatus having an optical axis extending in a light emitting direction of the light emitting apparatus comprising:

a base having an upper surface and a rear surface;

a first patterned electrode and a second patterned electrode each extending from the upper surface of the base to the rear surface thereof;

a light emitting device electrically connected to the first patterned electrode at the upper surface of the base;

a wiring portion connecting the light emitting device to the second patterned electrode; and a resin portion located adjacent the upper surface of the base, the resin portion configured to cover at least the light emitting device and the wiring portion, wherein:

the first and second patterned electrodes are separated from each other on both sides at each of the upper surface and the rear surface of the base with a predetermined distance;

the first and second patterned electrodes are configured such that a first ratio is a ratio of occupied area of the first and second patterned electrodes on the upper and rear surfaces of the base within a predetermined area, the predetermined area including an area of the upper surface and an area of the rear surface which coincide with the resin portion when viewed from along the optical axis of the light emitting apparatus, a second ratio is a ratio of occupied area of the first and second patterned electrodes on the upper and rear surfaces of the base within an adjacent area just outside of the predetermined area, the adjacent area being in contact with and extending from the predetermined area, the second ratio is smaller than the first ratio;

the first patterned electrode and the second patterned electrode are separated from each other to form a space on the rear surface of the base;

the space extends along and defines a substantially continually curving path in a width direction of the base;

the continually curving path extends from and contacts a first side of the base and extends to and contacts a second side of the base opposed to the first side; and the first side and second side are spaced from each other in a direction that is normal to a longitudinal axis of the base.

2. A light emitting apparatus having an optical axis extending in a light emitting direction of the light emitting apparatus, comprising:

a base having an upper surface and a rear surface;

a first patterned electrode and a second patterned electrode;

a light emitting device electrically connected to the first patterned electrode at the upper surface of the base;

a patterned metal is formed on the rear surface of the board;

a wiring portion connecting the light emitting device to the second patterned electrode; and a resin portion located adjacent the upper surface of the base, the resin portion configured to cover at least the light emitting device and the wiring portion, wherein:

the first and second patterned electrodes are exposed from the resin portion on the upper surface of the base;

parts of the first and second patterned electrodes exposed from the resin portion on the upper surface of the base have an area at which the light emitting apparatus is configured to be mounted on a mounting board;

the first and second patterned electrodes are separated from each other on the upper surface and the rear surface of the base with a predetermined distance; and the first and second patterned electrodes and the patterned metal are configured such that a first ratio is a ratio of occupied area of the first and second patterned electrodes on the upper surface of the base within a predetermined area, the predetermined area including an area of the upper surface which coincides with the resin portion when viewed from along the optical axis of the light emitting apparatus, and a second ratio is a ratio of occupied area of the first and second patterned electrodes on the upper surface of the base within an adjacent area just outside of the predetermined area, the adjacent area being in contact with and extending from the predetermined area, the adjacent area not including the area at which the light emitting apparatus is configured to be mounted on a mounting board, a third ratio is a ratio of occupied area of the patterned metal on the rear surface of the base within an area opposed to the predetermined area, a fourth ratio is a ratio of occupied area of the patterned metal on the rear surface of the base within an area opposed to the adjacent area just outside of the predetermined area, the second ratio is smaller than the first ratio, and the forth ratio is smaller than the third ratio.

* * * * *